United States Patent
Manna et al.

(10) Patent No.: US 9,406,509 B2
(45) Date of Patent: Aug. 2, 2016

(54) DEPOSITION OF HETEROATOM-DOPED CARBON FILMS

(71) Applicant: Applied Materials, Inc., Santa Clara, CA (US)

(72) Inventors: Pramit Manna, Santa Clara, CA (US); Abhijit Basu Mallick, Fremont, CA (US); Mukund Srinivasan, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/161,313

(22) Filed: Jan. 22, 2014

(65) Prior Publication Data
US 2015/0206739 A1 Jul. 23, 2015

(51) Int. Cl.
*H01L 21/31* (2006.01)
*H01L 21/027* (2006.01)
*H01L 21/311* (2006.01)

(52) U.S. Cl.
CPC ...... *H01L 21/0271* (2013.01); *H01L 21/31133* (2013.01)

(58) Field of Classification Search
None
See application file for complete search history.

(56) References Cited

U.S. PATENT DOCUMENTS

| | | | |
|---|---|---|---|
| 5,773,197 A * | 6/1998 | Carter et al. | 430/313 |
| 6,746,971 B1 * | 6/2004 | Ngo et al. | 438/780 |
| 7,294,568 B2 | 11/2007 | Goodner et al. | |
| 8,105,465 B2 | 1/2012 | Lee et al. | |
| 2005/0199013 A1 | 9/2005 | Vandroux et al. | |
| 2008/0268374 A1 | 10/2008 | Tashiro et al. | |
| 2011/0101507 A1 | 5/2011 | Akinmade Yusuff et al. | |
| 2011/0287633 A1 | 11/2011 | Lee et al. | |
| 2013/0001754 A1 | 1/2013 | Cho et al. | |
| 2013/0177848 A1 | 7/2013 | Kanto et al. | |
| 2013/0260560 A1 | 10/2013 | Mayers et al. | |
| 2014/0014965 A1 | 1/2014 | Kraus et al. | |

FOREIGN PATENT DOCUMENTS

JP 2009-513830 A 4/2009

OTHER PUBLICATIONS

International Search Report and Written Opinion for related application PCT/2015/012299 dated Apr. 30, 2015.

* cited by examiner

*Primary Examiner* — Kyoung Lee
(74) *Attorney, Agent, or Firm* — Patterson & Sheridan, LLP

(57) ABSTRACT

Easily removable heteroatom-doped carbon-containing layers are deposited. The carbon-containing layers may be used as hardmasks. The heteroatom-doped carbon-containing hardmasks have high etch selectivity and density and also a low compressive stress, which will reduce or eliminate problems with wafer bow. Heteroatoms incorporated into the hardmask include sulfur, phosphorous, nitrogen, oxygen, and fluorine, all of which have low reactivity towards commonly used etchants. When sulfur is used as the heteroatom, the hardmask is easily removed, which simplifies the fabrication of NAND devices, DRAM devices, and other devices.

13 Claims, 2 Drawing Sheets

DEPOSITION OF HETEROATOM-DOPED CARBON FILMS

BACKGROUND

1. Field

Embodiments of the present invention generally relate to a method and apparatus for fabricating a semiconductor device.

2. Description of the Related Art

Hardmasks are used to fabricate NAND and dynamic random access memory (DRAM) devices. Hardmasks are commonly used as sacrificial layers in lithographic patterning and enable, through an etching process, the patterning of features onto a layer of a semiconductor device. The patterned features can form, for example, the transistors and interconnects that allow the NAND and DRAM devices to operate.

The important properties of a hardmask material are etch resistance, compressive stress, mechanical properties, and removability. An ideal hardmask has a high etch resistance compared to the layer to be etch (hereinafter, an "underlayer") so that the underlayer etches in an etch process whereas the hardmask does not. A high etch resistance allows efficient transfer of the pattern of the hard mask to the underlayer. Etch resistance generally shows a positive correlation with hardmask density. An ideal hardmask also has a low compressive stress. A lower compressive stress eliminates undesirable wafer bow after hardmask deposition. Wafer bow can make further device fabrication difficult. In addition, an ideal hardmask has strong mechanical properties. For example, a high Young's modulus or hardness will reduce the line bending of high aspect ratio structures after a mask open step. Finally, an ideal hardmask is easily removed to simplify the fabrication process.

Current hardmasks are insufficient for developing next generation NAND and DRAM devices. As the feature sizes of NAND and DRAM devices decrease, etch selectivity and ease of removal need to increase while compressive stress needs to decrease. However, attempts at increasing etch selectivity have resulted in an increase in compressive stress, and attempts at decreasing compressive stress have resulted in a decrease in etch selectivity. For example, carbon-containing hardmasks with a high C:H ratio exhibit a good etch selectivity, but the materials have very high compressive stress.

Therefore, there is a need in the art for a hardmask having a high etch selectivity and a low compressive stress.

SUMMARY

Embodiments of the present invention are directed to a method of fabricating a hardmask, a method of processing a substrate, and a substrate and layers thereon that satisfy this need. The method of fabricating the hardmask includes introducing carbon precursors that contain at least one heteroatom into a processing chamber and generating a plasma to deposit a heteroatom-doped carbon-containing layer.

The method of processing a substrate includes forming a patterned layer above the heteroatom-doped carbon-containing layer. Thereafter, the heteroatom-doped carbon-containing layer can be etched.

The substrate and layers thereon include a layer containing a dielectric material. Above the dielectric layer is a patterned sulfur- or phosphorous-doped carbon-containing layer.

Heteroatom-containing carbon-containing hardmasks have a high etch selectivity and density and a low compressive stress. Doping the carbon-containing hardmask with a heteroatom eases compressive stress while increasing hardmask density. Doping the carbon-containing hardmask with sulfur and/or phosphorous increases etch selectivity by making the hardmask less reactive to active species commonly used in etching processes, such as $F^-$, $Cl^-$, and $Br^-$.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The descriptions of the various embodiments disclosed herein are presented for illustrative purposes and are not intended to be exhaustive. Many modifications and variations will be apparent to those of ordinary skill in the art without departing from the scope and spirit of the described embodiments. The terminology used herein was chosen to best explain the principles of the embodiments, the practical applications or technical improvements over technologies found in the marketplace, or to enable others of ordinary skill in the art to understand the embodiments disclosed herein.

Embodiments disclosed herein generally provide a carbon-containing layer doped with a heteroatom, such as sulfur, phosphorous, nitrogen, oxygen, and/or fluorine. The heteroatom-doped carbon-containing layer may be used as a hardmask or in other applications. If the heteroatom-doped carbon-containing layer is used as a hardmask, the layer may be used to fabricate NAND devices, DRAM devices, or other devices. Additional embodiments disclosed herein provide a method of fabricating the heteroatom-doped carbon-containing layer, such as by depositing by plasma enhanced chemical vapor deposition a layer from precursors containing carbon and a heteroatom. Other embodiments disclosed herein include a method of etching an underlayer, the method using a heteroatom-doped carbon-containing layer as a hardmask. Heteroatom-doped carbon-containing hardmasks have a high etch selectivity and density and a low compressive stress. Doping the carbon-containing hardmask with a heteroatom eases compressive stress while increasing hardmask density. Doping the carbon-containing hardmask with sulfur, phosphorous, nitrogen, oxygen and/or fluorine increases etch selectivity by rendering the hardmask less reactive to active species commonly used in etching processes, such as $F^-$, $Cl^-$, and $Br^-$. Sulfur-doped carbon-containing hardmasks are easily removable because such hardmasks form volatile $CO_2$ and $SO_2$ in the presence of an $O_2$ plasma, which is commonly used to remove hardmasks.

Figure 1:
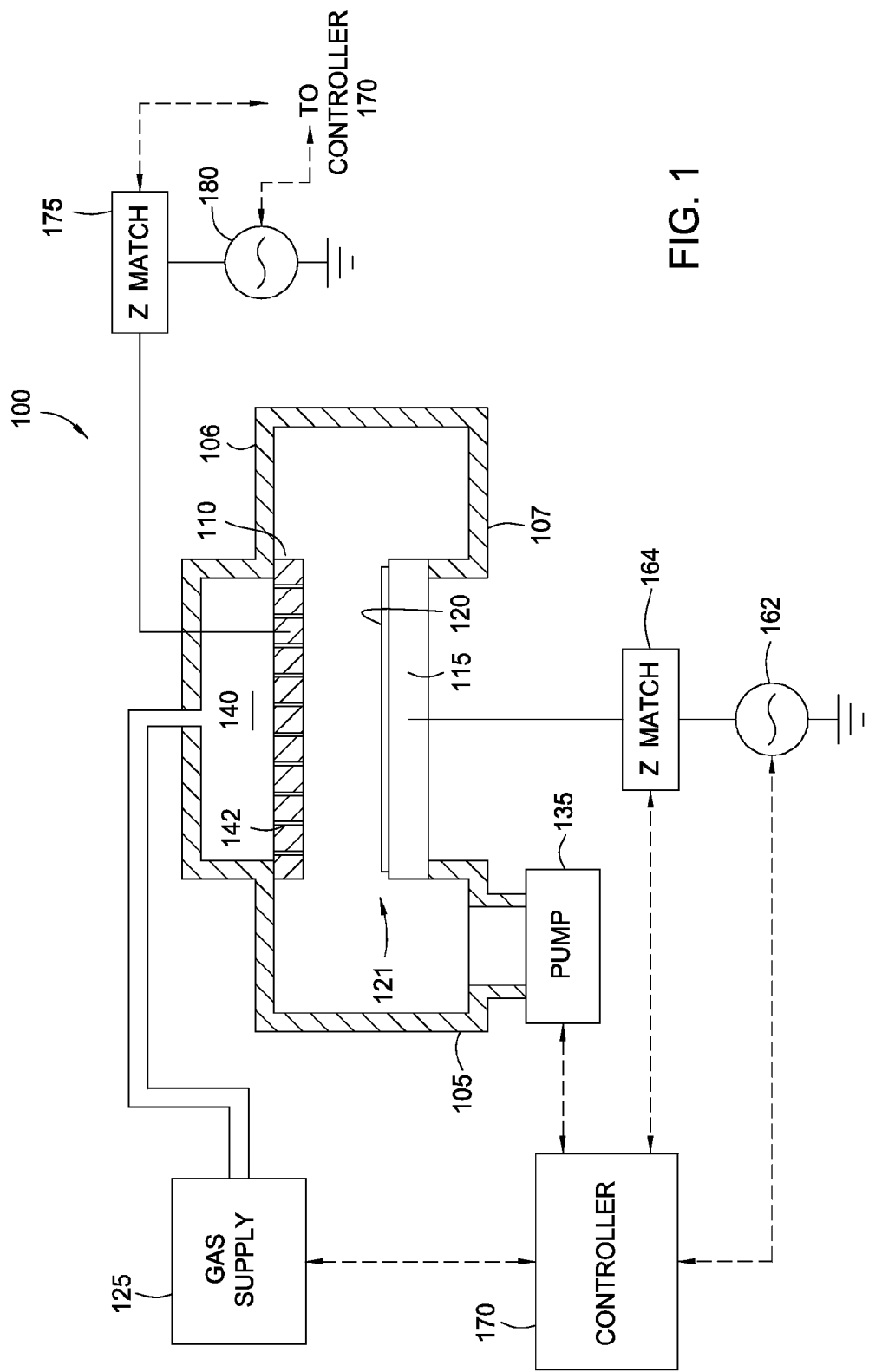
FIG. 1 depicts one embodiment of a processing chamber suitable for practicing embodiments of the embodiments disclosed herein.

FIG. 1 depicts a processing chamber 100 that may be used to practice embodiments of the invention. The processing chamber may be any plasma enhanced chemical vapor deposition (PECVD) chamber or system, including systems such as the CENTURA ULTIMA HDP-CVD™ system, PRODUCER APF PECVD™ system, and PRODUCER TEOS FSG PECVD™ system, available from Applied Materials, Inc. of Santa Clara, Calif. An exemplary PRODUCER® system is further described in commonly assigned U.S. Pat. No. 5,855,681, issued Jan. 5, 1999, which is herein incorporated by reference.

The processing chamber 100 has a sidewall 105, a ceiling 106, and a base 107 which encloses a processing region 121. A substrate pedestal 115, which supports a substrate 120, mounts to the base 107 of the chamber assembly 100. In certain embodiments, the substrate pedestal 115 is heated and/or cooled by use of embedded heat transfer fluid lines (not shown), or an embedded thermoelectric device (not shown), to improve the plasma process results on the substrate 120 surface. A vacuum pump 135 controls the pressure within the processing chamber 100. A gas distribution showerhead 110 may include a gas distribution plenum 140 connected to a gas supply 125 and can communicate with the processing region 121 over the substrate 120 through gas nozzle openings 142. The gas distribution showerhead 110, made from a conductive material (e.g., anodized aluminum, etc.), acts as a plasma controlling device by use of a first impedance match element 175 and a first RF power source 180. A bias RF generator 162 can apply RF bias power to the substrate pedestal 115 and substrate 120 through an impedance match element 164. A bias power applied to the substrate pedestal 115 can accelerate ions in the processing region 121 towards the substrate 120. A controller 170 is adapted to control the impedance match elements (i.e., 175 and 164), the RF power sources (i.e., 180 and 162) and certain other aspects of the plasma process. In certain embodiments dynamic impedance matching is provided to the substrate pedestal 115 and the gas distribution showerhead 110 by frequency tuning and/or by forward power serving.

Gases can be introduced to the processing region 121 via the gas nozzle openings 142 in gas distribution showerhead 110, or by other suitable means. The terms "gas" and "gases" are used interchangeably, unless otherwise noted, and refer to one or more precursors, reactants, catalysts, carrier, purge, cleaning, combinations thereof, as well as any other fluid introduced into the processing chamber 100. The term "precursor" is used to refer to any process gas which takes part in a reaction to either remove or deposit material from a surface. Precursors that may be introduced into the processing region include, for example, carbon compounds containing heteroatoms. Representative plasma-forming gases that may be introduced into the processing region 121 include argon, nitrogen, and helium.

A plasma may be generated and sustained in the processing chamber 100 by applying RF power from the first RF power source 180 to the showerhead 110 while the plasma-forming gases are introduced into the processing chamber 100. The carbon precursor gases can dissociate in the presence of the plasma and form a heteroatom-doped carbon-containing layer on the surface of the substrate 120 or on top of layers deposited on the substrate.

The deposition method that forms the heteroatom-doped carbon-containing layer includes the following steps, which may be performed in any order: at least one carbon precursor is introduced into the processing region 121; at least one plasma-forming gas is introduced into the processing region 121; and the temperature and pressure conditions of the processing chamber 100 are adjusted and a plasma is generated by the first RF power source 180.

Carbon precursors that may be introduced into the processing region 121 to form the heteroatom-doped carbon-containing layer include carbon precursors containing heteroatoms and carbon precursors not containing heteroatoms. As defined herein, a "heteroatom" includes any atom that is not carbon or hydrogen. For example, the heteroatom may be sulfur, phosphorous, oxygen, nitrogen, or fluorine. Sulfur, phosphorous, oxygen, nitrogen, and fluorine each are substantially unreactive with the active species of commonly used etchants, such as $F^-$, $Cl^-$, and $Br^-$. The choice of heteroatom may be based on the etchant intended to be used later in a later processing step. For example, if an etchant having F as the reactive species is to be used, a heteroatom or combination of heteroatoms that have an exceptionally low reactivity with $F-$ may be selected as the etchant. The at least one heteroatom-containing carbon precursor can include one or more precursors having different heteroatoms and/or one or more precursors having the same heteroatom. For example, the at least one heteroatom-containing carbon precursor can contain two unique sulfur-containing carbon precursors and two unique phosphorous-containing precursors. As defined herein, a "heteroatom-doped carbon-containing layer" includes a layer containing carbon and a heteroatom and is not limited to a layer formed by the methods disclosed herein.

Sulfur-containing carbon precursors may include carbon disulfide ($CS_2$), thiophene, thiols, and alkyl sulfides. Representative thiols include 1-propanethiol, 2-propanethiol, 1-decanethiol, and 1-dodecanethiol. The thiols may also be thiophenols. Thiophenols include molecules wherein the —SH group is bonded to an aromatic ring. Representative thiophenols include 2-mercaptophenol, 3-mercaptophenol, 4-mercaptophenol, 4-methoxythiophenol, 3,4-dimethoxythiophenol, 2-hydroxythiophenol, 4-(methylsulfonyl)thiophenol, thiocresols, and 4-aminothiophenols, including 4-aminothiophenol and substituted 4-aminothiophenols. Alkyl sulfides are commonly referred to as thioethers and include molecules having a —C—S—C-group. Representative alkyl sulfides include dimethyl sulfide, diethyl sulfide, and diisopropyl sulfide. The carbon to sulfur ratios of the sulfur-containing precursors may be from about 1:16 to about 2:1. The carbon to hydrogen ratios of the sulfur-containing precursors may be from about 1:3 to about 1:1.

Phosphorus-containing carbon precursors include monoalkyl phosphines di-alkyl phosphines, tri-alkyl phosphines, alkyl phosphine oxides, and aryl phosphines. Representative alkyl phosphines include trimethylphosphine, trioctylphosphine, and triallylphosphine. Representative alkyl phosphine oxides include trimethylphosphine oxide, triisopropylphosphine oxide, and trioctylphosphine oxide. Aryl phosphines include mono-aryl, di-aryl, and tri-aryl phosphines. Representative aryl phosphines include phenylphosphine, diphenylphosphine, triphenylphosphine, tri(p-tolyl)phosphine, tri(o-tolyl)phosphine, tri(m-tolyl)phosphine, allyldiphenylphosphine, and diphenyl(2-methoxyphenyl)phosphine.

Nitrogen-containing carbon precursors include alkyl amines, aryl amines, pyridine, N-methylpyridine, vinylpyridine, acetonitrile, and benzonitrile. Representative alkyl amines include trimethylamine and dimethyl amine. Representative aryl amines include aniline and toluidine.

Oxygen-containing carbon precursors include aldehydes, ketones, alcohols, and ethers. Representative aldehydes include acetaldehyde and benzaldehyde. Representative ketones include acetone and 2-butanone. Representative ethers include diethyl ether and tetrahydrofuran.

Fluorine-containing carbon precursors can also be used to form a heteroatom-doped carbon-containing layer. Representative fluorine-containing carbon precursors include tetrafluoroethylene, hexafluoropropylene oxide, octafluorocyclobutane, and hexafluoro-2-butyne.

Non-heteroatom-containing carbon precursors may be introduced into the processing chamber 100 along with the heteroatom-containing carbon precursors. For example, acetylene, propylene, butadiene, isoprene, allene, propyne, and butyne can be introduced. Non-heteroatom-containing carbon precursors can be used to control the carbon to heteroatom ratio of the heteroatom-doped carbon-containing layer.

The at least one plasma-forming gas that is introduced into the processing region 121 may include nitrogen, argon, hydrogen and/or helium. As used herein, a plasma-forming gas includes gases that can produce and sustain a plasma. Diluent gases, such as argon and/or helium may also be introduced into the processing region 121.

The processing conditions during deposition may be as follows. The temperature of processing chamber 100 may be maintained between 25° C. and 650° C., such as between about 400° C. and about 650° C. The pressure of the processing chamber 100 may be maintained between about 200 mTorr and about 30 Torr. The heteroatom-containing carbon precursor gases may be introduced into the processing chamber 100 at flow rates ranging from about 100 to about 10,000 sccm. If used, the flow rate of the non-heteroatom-containing carbon precursors may range from about 100 to about 10,000 sccm. The plasma-forming gases may be introduced into the processing chamber at flow rate ranging from about 100 sccm to about 10,000 sccm. If used, the flow rate of the diluent gases may range from about 100 sccm to about 1000 sccm. A plasma may be generated by applying an RF power between about 100 W and about 2000 W from the first RF power source 180 to the gas distribution showerhead 110. For example, the RF power may be between about 1000 W and about 2000 W. The resulting heteroatom-doped carbon layer may be amorphous.

In a representative example of the deposition of a sulfur-doped carbon-containing layer, carbon disulfide is introduced into the processing chamber 100 at a flow rate of 500 sccm. The plasma-forming gases introduced into the processing chamber 100 include argon which is introduced at a flow rate of 100 sccm. The temperature and pressure of the processing chamber 100 are 450° C. and 3 Torr, respectively. An RF power of 1800 W is applied to the gas distribution showerhead 110 from the first RF power source 180. Deposition is carried out for 10 seconds, and the resulting sulfur-doped carbon-containing layer has a thickness of about 100 Å. When carbon disulfide is used, the resulting layer will contain no C—H bonds.

In a second representative example of the deposition of a sulfur-doped carbon-containing layer, thiophene is introduced into the processing chamber 100 at a flow rate of 500 sccm respectively. The plasma-forming gases introduced into the processing chamber 100 include helium, which is introduced at a flow rate of 500 sccm. The temperature and pressure of the processing chamber 100 are 650° C. and 1 Torr, respectively. An RF power of 1000 W is applied to the gas distribution showerhead 110 from the first RF power source 180. Deposition is carried out for 60 seconds, and the resulting sulfur-doped carbon-containing layer has a thickness of about 1500 Å.

The C:H ratio of each heteroatom-doped carbon layer can be controlled by the C:H ratio of the heteroatom-containing carbon precursor and/or by including non-heteroatom-containing carbon precursors. Optionally, the deposited heteroatom-doped carbon-containing layer may be post-treated by a method configured to reduce the concentration of C—H bonds. Suitable post-treatment techniques include UV treatment, thermal annealing, microwave, e-beam and laser annealing.

Figure 2A:
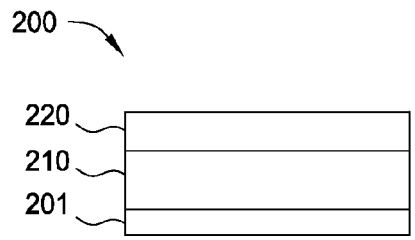
FIGS. 2A-2F are schematic side views of one embodiment of a process for using an carbon layer as described herein to etch an underlayer.

FIGS. 2A-2F are schematic side views of one embodiment of a process for using a heteroatom-doped carbon layer as a hardmask for etching an underlayer. FIG. 2A is a schematic illustration of a stack 200. As used herein, a "stack" includes a substrate 201 and one or more layers thereon. Stack 200 may have any number of layers, but only two are shown. Hardmask layer 220 is a heteroatom-doped carbon-containing hardmask layer disposed above underlayer 210. Hardmask layer 220 may be deposited according to the methods disclosed herein. As shown, underlayer 210 is the uppermost layer of the stack 200 prior to the deposition of the hardmask layer 220. The hardmask layer 220 may have a thickness ranging from about 2000 Å to about 20,000 Å.

Underlayer 210 may be a substrate, a layer deposited on a substrate, or a layer deposited on a layer deposited on a substrate. As used herein, "underlayer" includes any layer underneath a heteroatom-doped carbon-containing layer. The underlayer 210 may be, for example, a dielectric layer, such as silicon dioxide, silicon nitride, amorphous silicon, or mixtures thereof. A "dielectric" is a solid displaying insulating properties (energy gap typically wider than 5 eV); a dielectric's upper most energy band is completely empty. The underlayer 210 may also be a semiconductor material. The underlayer may be patterned or unpatterned. The substrate 201 may be, for example, silicon, an oxide of silicon, an oxide of aluminum, gallium arsenide, a ceramic, quartz, a metal (such as aluminum or copper), or any combination thereof.

Figure 2E:
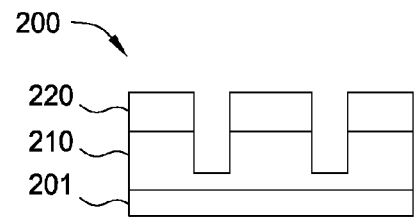
Figure 2B:
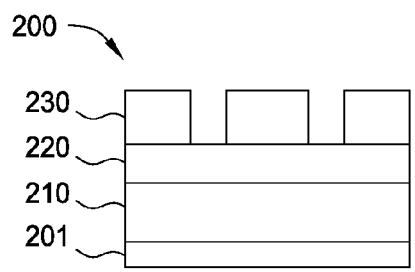

As shown in FIG. 2B, a patterned layer 230, such as a patterned photoresist layer, may be formed above the hardmask layer 220. The patterned layer 230 may be formed directly above the hardmask layer (as shown) or indirectly above the hardmask layer 220. The patterned layer 230 may be a polymeric material. Then, in FIG. 2C, the hardmask layer 220 is opened, such as by a plasma etching process or other means commonly known in the art, resulting in a patterned hardmask layer 220. If hardmask layer 220 is a phosphorous-doped carbon-containing hardmask layer, the hardmask layer may opened by using fluorine gases such as $SF_6$ and $NF_3$. Next, in FIG. 2D, the patterned layer 230 may be removed by means commonly known in the art.

Figure 2F:
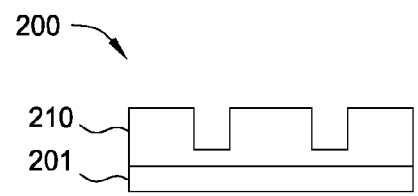
Figure 2C:
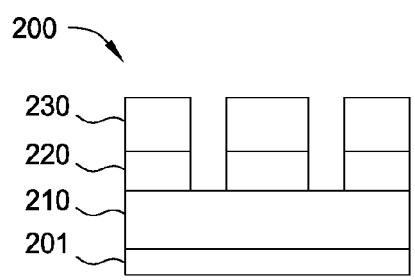
Figure 2D:
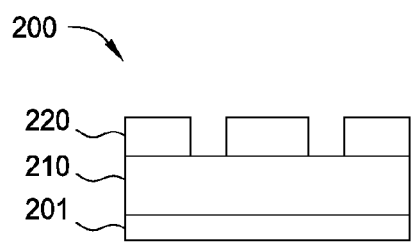

Subsequently, as shown in FIG. 2E, the underlayer 210 is etched using hardmask layer 220 to transfer features to the underlayer 210. The etching process may be a conventional dielectric etch process. The etchant may have $F^-$, $Cl^-$, or $Br^-$ as the active species. Finally, as shown in FIG. 2F, the hardmask may be removed. Hardmask removal is optional. The hardmask may be removed by an oxygen plasma using conventional means. Alternatively, the hardmask may be removed by other means well-known in the art. If the heteroatom-doped carbon-containing hardmask contains sulfur, the hardmask may be easily removed. Although not to be limited by theory, it is believed that the ease of removal of a sulfur containing hardmask is related to the generation of volatile $CO_2$ and $SO_2$ upon the reaction of the $O_2$ plasma with the sulfur and carbon-containing hardmask.

While the foregoing is directed to embodiments of the present invention, other and further embodiments of the invention may be devised without departing from the basic scope thereof, and the scope thereof is determined by the claims that follow.

The invention claimed is:

1. A method of forming a heteroatom-doped carbon-containing layer, the method comprising:
    introducing into a processing chamber at least one carbon precursor, the at least one carbon precursor containing at least one heteroatom, wherein the at least one carbon precursor comprises carbon disulfide; and generating a plasma to deposit a heteroatom-doped carbon-containing layer.

2. A method of forming a heteroatom-doped carbon-containing layer, the method comprising:
introducing into a processing chamber at least one carbon precursor, the at least one carbon precursor containing at least one heteroatom, wherein the at least one carbon precursor comprises a thiophenol; and
generating a plasma to deposit a heteroatom-doped carbon-containing layer.

3. The method of claim 2, wherein the thiophenol is selected from the group consisting of 2-mercaptophenol, 3-mercaptophenol, 4-mercaptophenol, 4-methoxythiophenol, 3,4-dimethoxythiophenol, 2-hydroxythiophenol, 4-(methylsulfonyl) thiophenol, and 4-aminothiophenol.

4. The method of claim 2, further comprising introducing into the processing chamber at least one non-heteroatom-containing carbon precursor.

5. The method of claim 4, wherein the at least one non-heteroatom-containing carbon precursor is selected from the group consisting of acetylene, propylene, butadiene, isoprene, allene, propyne, and butyne.

6. A method of forming a heteroatom-doped carbon-containing layer, the method comprising:
introducing into a processing chamber at least one carbon precursor containing at least one heteroatom, wherein the at least one carbon precursor comprises a carbon precursor selected from the group consisting of mono-alkyl phosphines, di-alkyl phosphines, tri-alkyl phosphines, alkyl phosphine oxides, and aryl phosphines; and
generating a plasma to deposit a heteroatom-doped carbon-containing layer, wherein the heteroatom-doped carbon-containing layer is deposited on a stack having an uppermost layer comprising a dielectric material.

7. The method of claim 6, wherein the at least one carbon precursor comprises triallylphosphine.

8. The method of claim 6, wherein the at least one carbon precursor comprises a triaryl phosphine.

9. The method of claim 8, wherein the at least one carbon precursor comprises a carbon precursor selected from the group consisting of phenylphosphine, diphenylphosphine, triphenylphosphine, tri(p-tolyl)phosphine, tri(o-tolyl)phosphine, tri(m-tolyl)phosphine, allyldiphenylphosphine, and diphenyl(2-methoxyphenyl)phosphine.

10. The method of claim 6, further comprising introducing into the processing chamber at least one non-heteroatom-containing carbon precursor.

11. The method of claim 10, wherein the at least one non-heteroatom-containing carbon precursor is selected from the group consisting of acetylene, propylene, butadiene, isoprene, allene, propyne, and butyne.

12. A method of forming a heteroatom-doped carbon-containing layer, the method comprising:
introducing into a processing chamber at least one carbon precursor containing at least one heteroatom, wherein the at least one carbon precursor containing at least one heteroatom is selected from the group consisting of carbon disulfide, thiophene, thiols, thiophenols, alkyl sulfides, mono-alkyl phosphines, di-alkyl phosphines, tri-alkyl phosphines, alkyl phosphine oxides, and aryl phosphines;
generating a plasma to deposit a heteroatom-doped carbon-containing layer, wherein the heteroatom-doped carbon-containing layer is deposited on a stack having an uppermost layer comprising a dielectric material;
forming a patterned layer above the heteroatom-doped carbon-containing layer; and
etching the patterned layer using an etchant having an active species selected from the group selected from $F^-$, $Cl^-$ and $Br^-$.

13. The method of claim 12, wherein the active species is $F^-$.

* * * * *